United States Patent [19]

Sherman

[11] Patent Number: 4,618,025

[45] Date of Patent: Oct. 21, 1986

[54] ACOUSTICAL DUCTING FOR SPEAKERS AND ENCLOSURES

[76] Inventor: Dan R. Sherman, 4235 S. Oswego, Tulsa, Okla. 74135

[21] Appl. No.: 187,510

[22] Filed: Sep. 15, 1980

[51] Int. Cl.[4] .................................. H05K 5/00

[52] U.S. Cl. .................................. 181/148; 181/153; 181/156; 181/199

[58] Field of Search .................................. 181/148-157, 181/199; 179/146 E

[56] References Cited

U.S. PATENT DOCUMENTS

| | | | |
|---|---|---|---|
| 2,295,483 | 9/1942 | Knowles | 181/148 X |
| 2,512,323 | 6/1950 | Gersch | 181/157 |
| 2,713,396 | 7/1955 | Tavares | 181/199 |
| 3,385,393 | 5/1968 | Gold | 181/148 X |
| 3,978,941 | 9/1976 | Siebert | 181/156 X |
| 4,031,318 | 6/1977 | Pitre | 181/148 X |

*Primary Examiner*—Benjamin R. Fuller
*Attorney, Agent, or Firm*—Head, Johnson & Stevenson

[57] ABSTRACT

In an acoustical speaker having a movable diaphragm responsive over a range of frequencies, an air duct having a cross-sectional area less than that of the diaphragm substantially surrounding the diaphragm and in communication with one side thereof for acoustically isolating the diaphragm, dampening low-frequency ringing and acoustically loading the diaphragm for extending the frequency range to lower frequencies to enhance the performance of the speaker with small speaker enclosures. One embodiment provides for similar ducting for passive radiator diaphragms.

5 Claims, 13 Drawing Figures

ACOUSTICAL DUCTING FOR SPEAKERS AND ENCLOSURES

BACKGROUND OF THE INVENTION

1. Field of the Invention

The present invention relates to improvements in ducting for acoustical speakers and enclosures and more particularly, but not by way of limitation, to a three-purpose duct which is acoustically coupled with a speaker diaphragm whether active or passive, for dampening low-frequency ringing, acoustically isolating the diaphragm and acoustically loading the diaphragm for lower frequency response.

2. History of the Prior Art

The use of quality sound systems in both the home and in businesses are often times limited by the size limitations on the speaker enclosures and hence, there has been considerable effort to achieve big sound while utilizing a small enclosure. Various types of ducting has been accomplished in connection with the speaker enclosures in an attempt to effectively extend the frequency response curve at the low end.

Since low frequency response is largely dependent on the loud speaker system resonance, current designs usually rely on an enclosure that is proportionally large in relation to the driver. Stated another way, the larger the enclosure, the lower the frequency resonance. The driver, or any other moving piston in connection with the enclosure represents an enclosure opening. The smaller the enclosure opening is, again the lower the resonance is. Therefore, reducing the enclosure size means reducing the driver size as well if low frequency performance is to be maintained.

However, in the case of small enclosures, the driver size must be too small to be an efficient radiator if low frequency performance is the objective. Also, power handling ability is decreased with the use of small drivers. Therefore, it is a practice of most small loud speaker system designs to use a larger driver in order to keep efficiency reasonable, trading low frequency performance as a result of the larger effective enclosure openings.

Increasing the mass of a larger speaker in order to obtain lower frequency response has been accomplished by adding a papier mache weight to the center of the speaker cone on a conventional speaker so that that speaker may be used in a smaller enclosure. The addition of weight lowers the resonance of the speaker so that when it is coupled to an enclosure the added mass to the loud speaker diaphragm will help to lower the overall resonance of the loud speaker and enclosure together. Although the added weight lowers the resonance of the loud speaker, its ability to reproduce higher frequencies has been traded for the lower resonance.

Often times additional openings will be provided in the enclosure and are connected to ducting within the enclosure in order to tune the overall resonance of the system while allowing the energy from the rear of the loud speaker cone to be added to the front wave which has met with reasonable success.

Another conventional device to further tune the enclosure is by the addition of a passive radiator which serves to transfer sound into the surrounding outside area.

Another problem associated with the use of large speaker assemblies or passive radiators for that matter, is the tendency for these large diaphragms to continue ringing after the electrical signal has been terminated from the driver.

The added weight to the speaker cone hereinbefore mentioned actually increases the system ringing and, as stated, results in a significant sacrifice in the speaker's ability to reproduce higher frequencies with the added weight.

The patent to Pitre, U.S. Pat. No. 4,031,318, issued June 21, 1977 for "High Fidelity Loudspeaker System" shows ducting surrounding the speaker but does not reduce the effective area of the opening.

In summary, the various attempts at providing big sound with small speaker enclosures has met with, at best, limited success.

SUMMARY OF THE INVENTION

The present invention provides for acoustical ducting to be operably connected to the vibrating diaphragms themselves, whether they be active or passive, as opposed to simple ducting within the speaker enclosure itself. The present invention provides ducting to make possible low frequency response from a loud speaker system having an enclosure that is smaller, in proportion to the moving piston elements, than the enclosures used in conventional designs, all without serious trade-offs of desirable for undesirable characteristics.

In the case of an active speaker diaphragm, the ducting substantially surrounds the rear surface of the diaphragm and provides a restricted air passageway between the rear surface of the diaphragm and the interior of the enclosure. This ducting between the diaphragm and the enclosure serves to effectively reduce the area of the opening occupied by the driver. The amount of area reduction naturally depends on the size of the duct but because the enclosure opening has been effectively reduced in area, enclosure resonance remains low thereby enabling the system to respond at low frequencies in the region of the resonance. Whereas the use of the duct somewhat reduces efficiency, use of the larger driver more than offsets this reduction in efficiency and the net result is higher efficiency for the same enclosure size.

Other advantages of using the ducting in this manner also become apparent. Air that is moved by the rear of the loud speaker cone or diaphragm is forced to move through this restrictive ducting which, because of the reduced area, serves to restrict the air flow and thus, dampens the movement of the loud speaker cone to prevent ringing after the electric signal is terminated.

Further, since a specific air mass is enclosed within the volume of the duct, the air mass has a specific resonance. This air mass serves to couple to the mass of the diaphragm which, at low frequencies, tends to have the effect of adding mass to the driver to lower the resonance of the driver. However, since the air is somewhat springy, high frequency performance is substantially unaffected.

The same ducting principle applies in the use of a passive radiator diaphragm as to the active driver. The passive radiator diaphragm can be quite large in proportion to the enclosure when a duct is used between the enclosure and the passive radiator. The gain by using a duct embodying the present invention is more efficient coupling of the passive radiator to the surrounding outside air to be excited as sound waves, especially at low frequencies. In addition, by using the present ducting with a larger passive radiator, the excursion of the passive radiator is less, thereby reducing forces of inertia.

In summary, the present invention allows the enclosure size of the speaker system to be reduced, still offering low frequency response while virtually leaving the high frequency response unaffected.

DESCRIPTION OF THE DRAWINGS

Other and further advantageous features of the present invention will hereinafter more fully appear in connection with a detailed description of the drawings in which.

DESCRIPTION OF THE PREFERRED EMBODIMENTS

Figure 2:
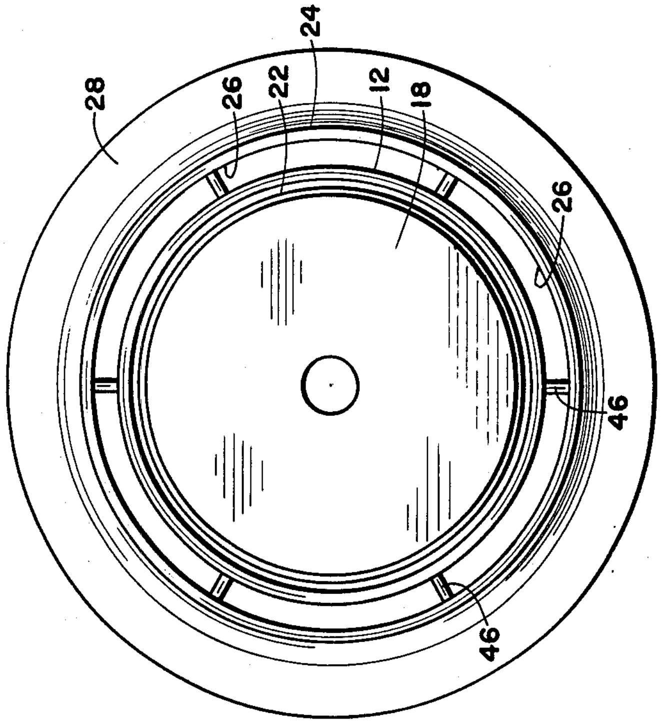
FIG. 2 is a rear end elevational view of the speaker of FIG. 1.
Figure 1:
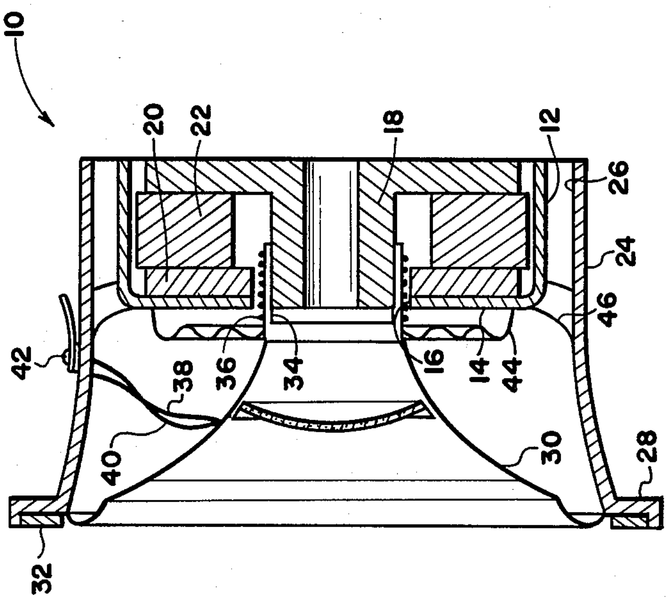
FIG. 1 is a side elevational sectional view of an acoustical speaker embodying the present invention.

Referring to the drawings in detail, reference character 10 generally indicates an acoustical speaker comprising a first support housing 12 which is usually cylindrical in shape having a front end wall 14 with a central aperture or gap 16 therein.

A pole piece cylinder 18 is typically secured to the housing 12 through a permanent magnet 22 and a plate member 20 and extends into the gap 16.

The speaker includes an outer substantially cylindrical housing 24, the walls of which are spaced from the housing 12 to provide an annular cylindrical duct or passageway 26 therebetween. The forward end of the outer housing 24 is provided with a flange 28. The speaker further comprises a truncated conical shaped diaphragm 30, the outer or forward end of the diaphragm being connected to the flange 28 around the outer periphery thereof by means of a suitable retaining ring 32. The flange 28 is also usable to connect the speaker to an enclosure as will be hereinafter set forth.

The rear end or smaller end of the conical shaped diaphragm 30 is provided with a cylindrical core member 34 which surrounds the pole of the magnet 18 and is slidably disposed therearound.

A coil 36 is provided around the outer periphery of the core 34 having end wires 38 and 40 being connected to an exterior terminal 42 for subsequent connection to the audio output of an amplifier (not shown). Flexible webbing members 44 are mechanically connected between the movable core 34 and the inner housing 12 to support the cone diaphragm with respect to the housing 12. Further supporting webs or vanes 46 are connected between the housing 12 and the housing 24 to insure mechanical stability therebetween. The cross-sectional area, length and volume of the duct 26 are of a predetermined size based on the desired resonant results which is relative to both the speaker size and the size of the enclosure in which the speaker is mounted.

The diaphragm 30 and associated driver coil 36 operate in a typical manner in which the diaphragm is excited by means of electrical signals provided to the coil 36 in conjunction with the magnet 18. This vibration causes sound waves to exit the front or outside surface of the diaphragm 30 while a second set of rearwardly directed sound waves exit the rear surface of the diaphragm and are channeled through the duct 26.

Figure 3:
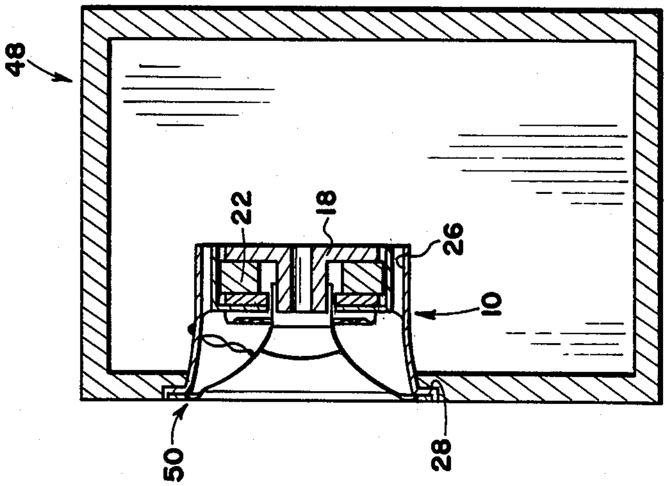
FIG. 3 is a side elevational sectional view of the speaker of FIG. 1 mounted in an enclosure.

Referring now to FIG. 3, reference character 48 generally indicates a simple closed speaker enclosure having a fixed volume, a front wall thereof being provided with an aperture 50 for receiving the ducted speaker 10 therein. The flange member 28 may be utilized for securely fastening the speaker 10 within the enclosure 48. The speaker enclosure 48 is indicative of a small enclosure which would normally be too small for the size of the speaker shown. However, by utilizing the annular duct 26 between the diaphragm 30 and the interior of the speaker enclosure, the opening occupied by the speaker has been effectively reduced in area. Therefore, the enclosure resonance remains low enabling the system to respond at low frequencies in the region of the resonance while still taking advantage of being able to use the larger driver in the small enclosure.

Figure 6:
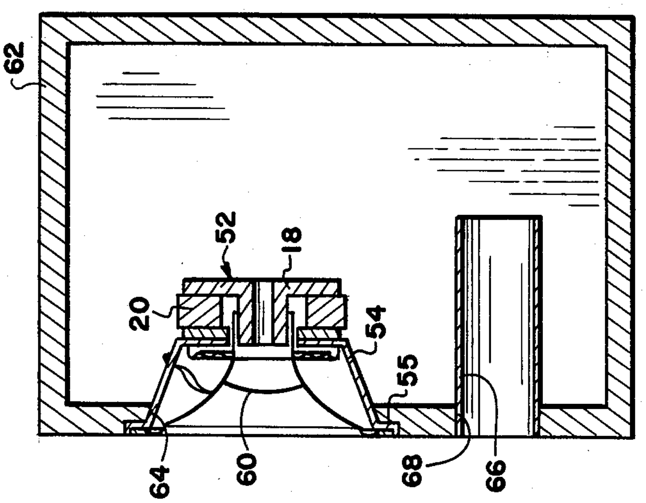
Fig. 6 (PRIOR ART)
FIG. 6 is a side elevational sectional view of the speaker of FIG. 4 mounted in an enclosure.
Figure 5:
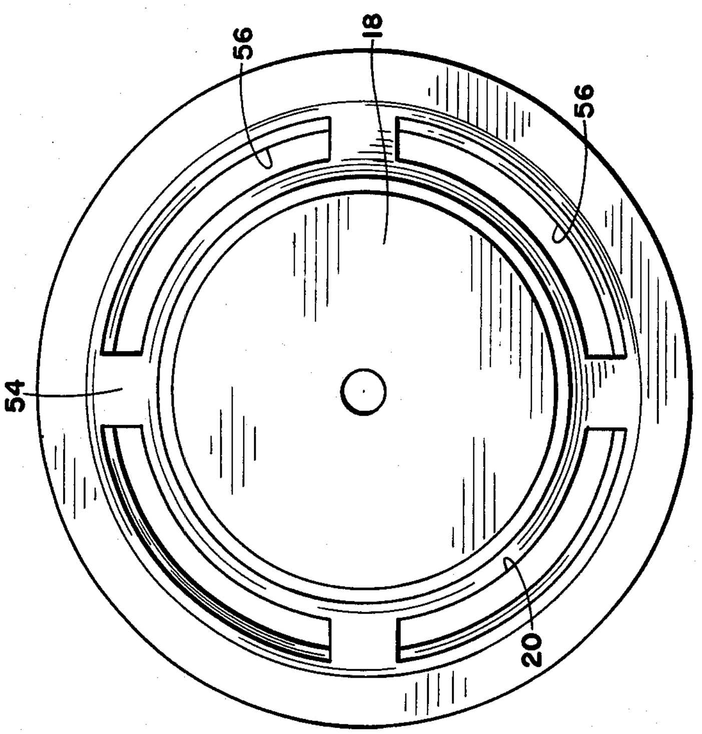
Fig. 5 (PRIOR ART)
FIG. 5 is an end view of the speaker of FIG. 4.
Figure 4:
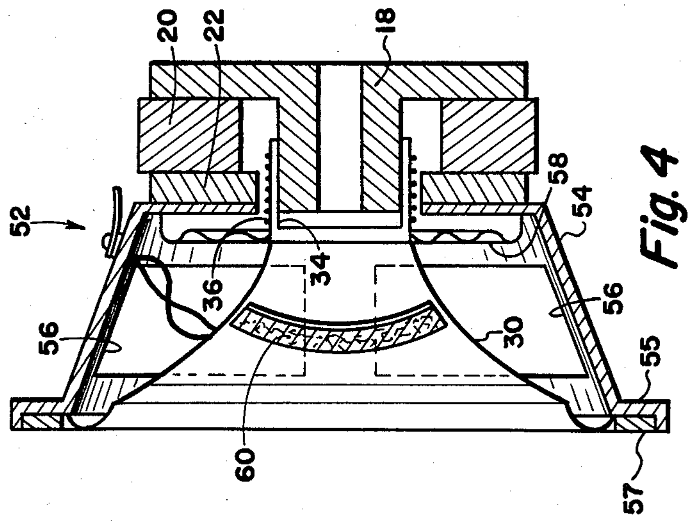
Fig. 4 (PRIOR ART)
FIG. 4 is a side elevational sectional view of a current acoustical speaker.

Referring now to FIGS. 4, 5 and 6 of the drawings, reference character 52 generally indicates a typical speaker currently in use. For ease in understanding, the common elements of the speakers 52 and 10 will be designated by the same reference characters with the differences in the speakers pointed out.

The speaker 52 is provided with a pole piece 18 which is rigidly secured to a truncated conical shaped plate member which represents the housing of the speaker 54. This housing 54 is typically constructed in the manner of a framework and is provided with a plurality of apertures 56 therein to provide open communication between the diaphragm 30 and the interior of an enclosure in which the speaker may be mounted. The diaphragm 30 is again operably connected to a core member 34 which is surrounded by a coil 36. Support structure in the form of flexible webbing 58 is operably connected between the core 34 and the housing member 54.

A loading element 60 which may be made of papier mache or other material is shown attached to the diaphragm 30 in order to increase the mass, thereby lowering the frequency response of the diaphragm for use in enclosures that would normally be too small for that particular speaker size.

The speaker 52 may be installed in a suitable housing 62 by attaching the speaker 52 to an aperture 64 in the housing. The speaker enclosure 62 and associated speaker 52 as shown in FIG. 6, depict the standard method of utilizing duct work in an enclosure in order to tune the overall resonance of the system while allowing the energy from the rear of the loud speaker cone or diaphragm to be added to the front wave. This duct is indicated by reference character 66 and is provided through an aperture 68 in the housing. Tuning by use of the duct 66 is controlled by the length and cross-sectional area of the duct. Hence, the enclosure 62 illustrates the conventional mode of utilizing a rather large speaker 52 within a small enclosure 62. However, it is pointed out that the addition of the papier mache mass 60 greatly reduces the performance of the speaker in the high frequency range.

Figure 7:
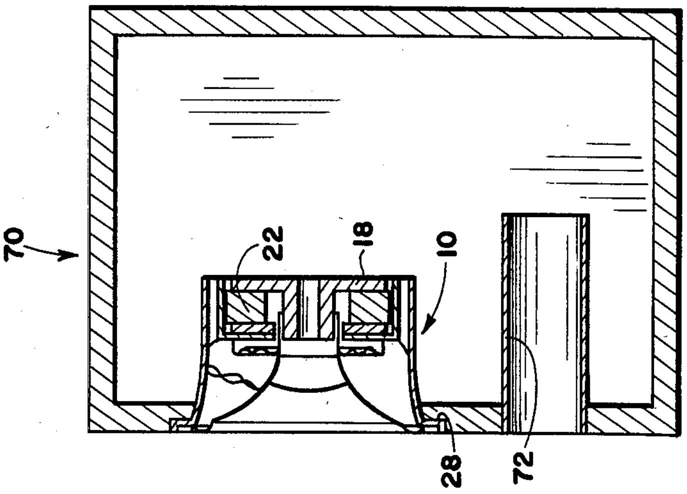
FIG. 7 is a side elevational sectional view of a second embodiment of the enclosure of FIG. 3.

Referring now to FIG. 7, reference character 70 generally indicates an enclosure of the type of 62 having a ducted speaker 10 being installed in one wall of the enclosure. A duct 72 may be added to the enclosure for tuning purposes in much the same manner as provided in the enclosure depicted in FIG. 6.

Figure 8:
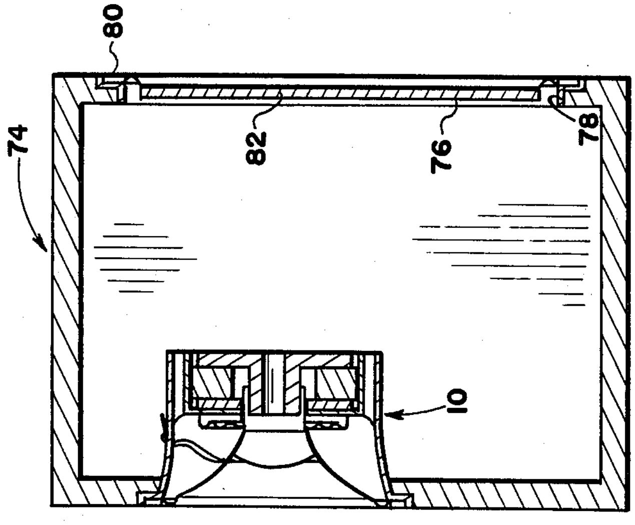
FIG. 8 is a side elevational sectional view of an enclosure equipped with a passive radiator.

Referring now to FIG. 8, reference character 74 generally indicates another type of enclosure wherein the ducted speaker 10 is mounted in one wall of the enclosure while a passive radiator diaphragm 76 is installed within a large opening 78 on the opposite face of the enclosure 74. The aperture 78 may be round or may be polygonal in shape to match the shape of the speaker enclosure and generally comprises an attachment frame 80 around the outer periphery of the diaphragm 76 which is secured to the aperture 78 by any type of fastener well known in the art.

The vibrational characteristics of the diaphragm 76 can be controlled not only in size but by the use of a massive plate 82 on one surface thereof. The acoustical energy within the enclosure excites the passive radiator diaphragm 76 which transfers sound energy to the surrounding outside air and also serves to further tune the enclosure by the mass of the passive radiator.

Figure 9:
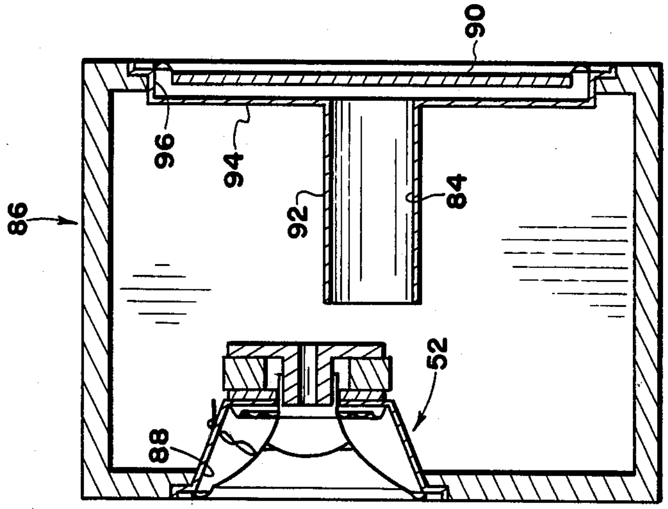
FIG. 9 is a side elevational sectional view of an enclosure with a passive radiator embodying the present invention.

Again, the mass of the passive radiator may be increased due to the dampening effect of a tuned duct member 84 depicted in connection with the enclosure of FIGURE 9. Also due to the velocity and pressure change in the duct, the response characteristics of the passive radiator will have an extended range. The enclosure of FIG. 9 is represented by reference character 86 and is shown in this particular figure with a conventional speaker 52 being mounted in an aperture 88 in the front of the enclosure with a passive radiator 90 located on the opposite wall from the speaker 52.

The duct 84 is provided by means of a cylindrical sleeve member 92 which extends into the housing and may have substantially any cross-sectional shape. The outer end of the sleeve member 92 is provided with a flange plate 94 which terminates at the outer edge thereof with an attachment flange 96. The flange plate 94 and attachment flange 96 completely surround the passive radiator diaphragm 90 in order to acoustically isolate that diaphragm from the interior of the cabinet.

The duct 84 serves to work in the same way as the duct 26 in the speaker 10 in that it effectively lowers the resonance frequency of the diaphragm 90. This permits the rather large passive radiator diaphragm 90 to be installed in a relatively small enclosure 86 while further serving to reduce the resonance frequency thereof.

Figure 10:
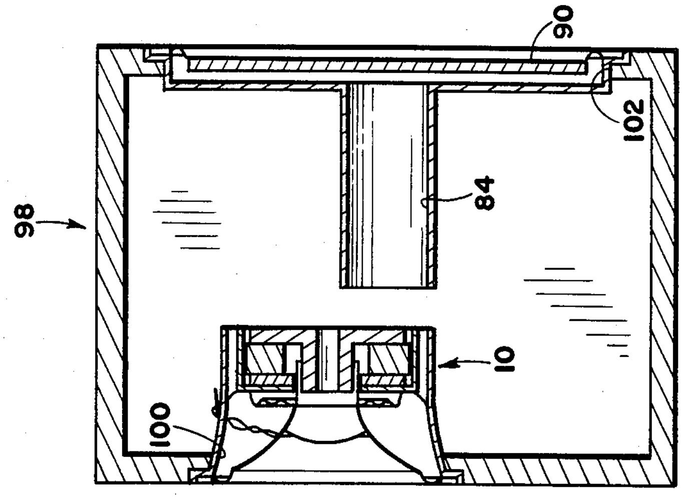
FIG. 10 is a side elevational sectional view of a speaker enclosure embodying the present invention.

Referring now to FIG. 10, reference character 98 generally indicates an enclosure having the speaker 10 mounted in a front aperture 100 thereof and having the passive radiator 90 mounted in a rear aperture 102 of the enclosure. The passive radiator 90 is further acoustically isolated by the duct member 84. Hence, the speaker depicted in FIG. 10 shows the use of a ducted active speaker and a ducted passive radiator, both serving to lower the effective resonance frequency of a rather small enclosure while still using relatively large speaker and radiator elements.

Figure 11:
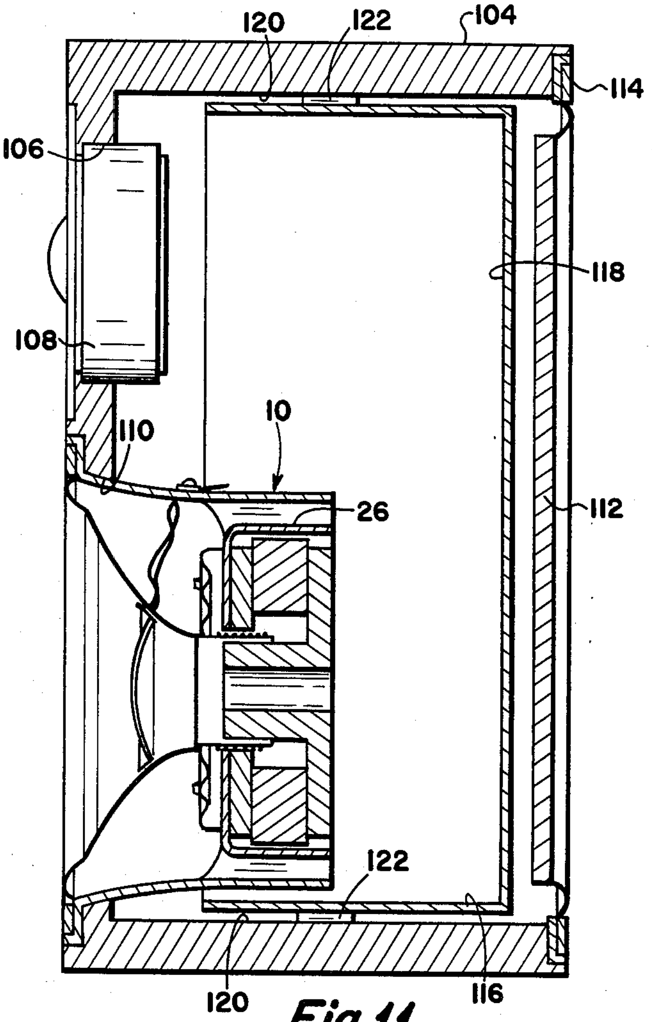
FIG. 11 is a side elevational sectional view of a speaker enclosure embodying the present invention.

Referring now to FIG. 11, reference character 104 indicates a speaker enclosure having a first small aperture 106 in the front face thereof for receiving and supporting a typical high frequency range speaker 108 therein. A second aperture 110 is provided in the front face of the enclosure for mounting the ducted speaker 10 therein. A passive radiator 112 covers substantially the entire opposite wall of the enclosure 104 and is secured to the housing by flange attachment members 114.

The interior of the enclosure 104 is provided with cylindrical inner walls 116 which are closed at one end by a plate member 118. The walls 116 are separated from the inside surface of the walls of the enclosure 104 thereby providing a large hollow cylindrical duct 120 therebetween. The inner wall 116 may be supported in its spaced relationship with the housing by suitable supporting blocks 122 located around the periphery thereof.

Hence, in this particular case the duct 26 of the ducted speaker 10 serves to acoustically isolate the diaphragm of the speaker while the duct 120 serves to acoustically isolate the passive radiator member 112. This particular design would allow the use of a rather small enclosure 104 with a greatly improved low frequency response due to the ducting of the speaker and the passive radiator while the upper or high frequencies outside of the range of the speaker 10 may be adequately handled by the high frequency speaker 108.

Figure 12:
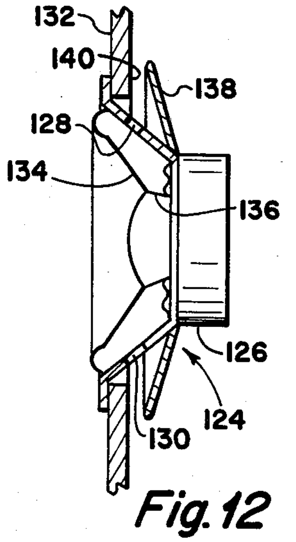
FIG. 12 is a side elevational sectional view of a second embodiment of an acoustical speaker embodying the present invention.
Figure 13:
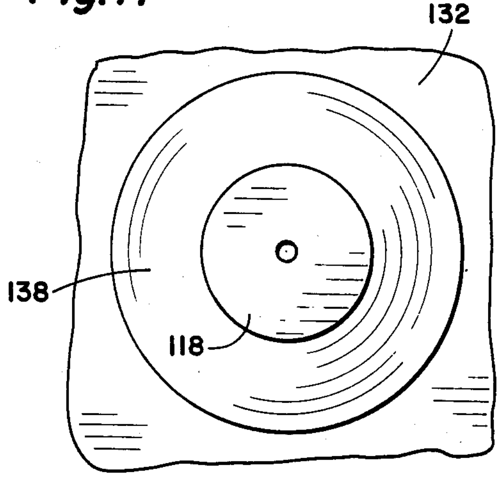
FIG. 13 is an end view of the speaker of FIG. 12.

Referring now to FIG. 12, reference character 124 generally indicates a second embodiment of the ducted speaker. The speaker 124 comprises a permanent magnet arrangement 126 which is structurally connected to a speaker housing plate 128. The housing plate 128 is provided with a plurality of apertures 130 therein. The housing member 128 may be attached then to a speaker enclosure wall indicated by reference character 132. The front end of the speaker is provided with a cone diaphragm element 134 the front outer periphery thereof being attached to the housing plate 128 while the inner end thereof is carried by a suitable core member 136. A second truncated conical shaped plate member 138 is secured to the aft end of the housing plate 128 and extends outwardly and forwardly to form an annular duct or passageway 140 between the interior of the enclosure 132 and the inside surface of the plate member 138.

Hence, the annular duct or passageway 140 serves to acoustically isolate the diaphragm 134 from the interior of the enclosure thereby reducing the effective area of the opening and hence, reducing the resonance frequency of the speaker.

It is noted that the length of the duct 140 in this configuration extends radially outward so that if the duct 140 were disc shaped, the outer circumference or end of the duct would represent a larger cross-sectional area than the inner portion. Hence, the truncated conical shaped plate member 138 serves to reduce the distance between the plate 138 and the interior of the enclosure wall 132 as the distance along the duct increases thereby maintaining substantially constant cross-sectional area over the length of the duct. The duct 140 as with the duct 126, may vary in cross-sectional area over the length of the duct. Since the duct 26 for the speaker is of a regular cylindrical shape, the cross-sectional area is constant throughout the duct. This is also true of the duct 84 of the passive radiators of FIGS. 9 and 10, as well as the duct 120 of the passive radiator depicted in FIG. 11.

It is also noted that the duct may be integral to the diaphragm support members or integral to the enclosure surrounding the speaker or diaphragm opening.

From the foregoing it is apparent that the present invention provides a ducting device for use with both active and passive speaker elements for providing acoustical isolation between the enclosure and the speaker element, for dampening low frequency ringing and for effectively reducing the speaker area opening for lowering resonance of the speaker diaphragm.

Whereas the present invention has been described in particular relation to the drawings attached, other modifications apart from those shown or suggested herein may be made within the spirit and scope of the invention.

What is claimed is:

1. In an acoustical speaker having a movable diaphragm, an improvement comprising a first cylindrical housing, a first end of which surrounds the diaphragm and which is of a predetermined length, the second end terminating rearwardly of the diaphragm, a second cylindrical housing disposed concentrically within the first cylindrical housing, a rear end of which is coterminous with the second end of the first cylindrical housing to form an annular duct of predetermined cross-sectional area less than that of the diaphragm for acoustically isolating the diaphragm, for dampening ringing of the diaphragm and for extending the frequency range of the speaker at low frequencies.

2. A speaker as set forth in claim 1 and including means operably connected to the movable diaphragm for driving said diaphragm and wherein said second cylindrical housing surrounds said means for driving the diaphragm.

3. A speaker as set forth in claim 2 wherein the means for driving the diaphragm comprises electrically actuated speaker coils carried behind the diaphragm and operably connected thereto.

4. A speaker as set forth in claim 1 and including a speaker enclosure, a port within said enclosure and wherein the diaphragm is mounted in said port, said duct providing communication between the rear side of the diaphragm and the interior of the enclosure.

5. A speaker comprising a speaker enclosure having an aperture therein, a passive radiator diaphragm mounted in said aperture, a cylindrical housing secured to said enclosure and surrounding the diaphragm, the space between said diaphragm and said housing comprising a duct, a second cylindrical housing operably connected to the first cylindrical housing forming a second duct for providing communication between one side of the radiator diaphragm and the interior of the enclosure for acoustically isolating the diaphragm, for dampening ringing of the diaphragm and for extending the frequency of the diaphragm at low frequencies.

* * * * *